(12) United States Patent
Palese et al.

(10) Patent No.: US 11,934,048 B2
(45) Date of Patent: Mar. 19, 2024

(54) PHOTONIC INTEGRATED CIRCUIT-BASED COHERENTLY PHASED ARRAY LASER TRANSMITTER

(71) Applicant: Raytheon Company, Waltham, MA (US)

(72) Inventors: Stephen P. Palese, Redondo Beach, CA (US); Avram Bar-Cohen, late of, CA (US)

(73) Assignee: Raytheon Company, Tewksbury, MA (US)

( * ) Notice: Subject to any disclaimer, the term of this patent is extended or adjusted under 35 U.S.C. 154(b) by 534 days.

(21) Appl. No.: 17/162,860

(22) Filed: Jan. 29, 2021

(65) Prior Publication Data

US 2022/0244578 A1 Aug. 4, 2022

(51) Int. Cl.
| | |
|---|---|
| G02F 1/01 | (2006.01) |
| G01J 1/42 | (2006.01) |
| H01S 5/024 | (2006.01) |
| H01S 5/04 | (2006.01) |
| H01S 5/40 | (2006.01) |

(52) U.S. Cl.
CPC ............ G02F 1/011 (2013.01); G01J 1/4257 (2013.01); H01S 5/02469 (2013.01); H01S 5/041 (2013.01); H01S 5/40 (2013.01); *G02F 2203/50* (2013.01)

(58) Field of Classification Search
CPC .... G02F 1/011; G02F 2203/50; G01J 1/4257; H01S 5/02469; H01S 5/041; H01S 5/40
USPC ......................................................... 356/225
See application file for complete search history.

(56) References Cited

U.S. PATENT DOCUMENTS

| | | |
|---|---|---|
| 3,975,628 A | 8/1976 | Graves et al. |
| 7,408,507 B1 | 8/2008 | Paek et al. |
| 7,729,572 B1 | 6/2010 | Pepper et al. |
| 7,949,030 B2 | 5/2011 | Volodin |
| 8,068,235 B1 | 11/2011 | Marron et al. |
| 10,790,909 B1 | 9/2020 | Suni |
| 10,838,222 B2 | 11/2020 | Khachaturian et al. |

(Continued)

FOREIGN PATENT DOCUMENTS

| | | |
|---|---|---|
| EP | 3761528 A1 | 1/2021 |
| JP | 2011060982 A * | 3/2011 |

OTHER PUBLICATIONS

Abediasl et al., "Monolithic optical phased-array transceiver in a standard SOI CMOS process", Optics Express, vol. 23, No. 5, Mar. 2015, 11 pages.

(Continued)

*Primary Examiner* — Michael A Lyons
*Assistant Examiner* — Omar H Nixon (57) ABSTRACT

An apparatus includes a photonic integrated circuit, which includes at least one splitter configured to split at least one input beam into multiple input beamlets and multiple phase modulators configured to phase-shift at least some of the input beamlets. The apparatus also includes an array of optical amplifiers configured to amplify the phase-shifted input beamlets and generate amplified beamlets. The apparatus further incudes a beam combiner configured to combine the amplified beamlets and generate an output beam. In addition, the apparatus includes a controller configured to control the phase modulators in order to adjust phasing of the phase-shifted input beamlets.

20 Claims, 7 Drawing Sheets

(56) References Cited

U.S. PATENT DOCUMENTS

| | | | |
|---|---|---|---|
| 11,029,465 | B1 | 6/2021 | Rakowski et al. |
| 11,102,426 | B1* | 8/2021 | Kendrick ............... H04N 23/56 |
| 2006/0239312 | A1 | 10/2006 | Kewitsch et al. |
| 2015/0262905 | A1* | 9/2015 | Salamon ............ H01L 23/3735 257/713 |
| 2015/0293224 | A1 | 10/2015 | Eldada et al. |
| 2015/0378241 | A1* | 12/2015 | Eldada .................... G02F 1/292 359/299 |
| 2016/0013866 | A1* | 1/2016 | Doerr ...................... G02B 6/00 398/139 |
| 2016/0094016 | A1 | 3/2016 | Beach et al. |
| 2017/0170556 | A1 | 6/2017 | Carey et al. |
| 2017/0234984 | A1 | 8/2017 | Khial et al. |
| 2017/0324162 | A1 | 11/2017 | Khachaturian et al. |
| 2018/0039154 | A1 | 2/2018 | Hashemi et al. |
| 2018/0107091 | A1 | 4/2018 | Hosseini et al. |
| 2019/0072730 | A1* | 3/2019 | Baehr-Jones .......... G02F 1/011 |
| 2019/0260123 | A1 | 8/2019 | Poulton et al. |
| 2019/0260124 | A1 | 8/2019 | Davoyan et al. |
| 2019/0391348 | A1 | 12/2019 | Osenbach et al. |
| 2020/0150346 | A1* | 5/2020 | Cavaliere ........... G02B 6/12007 |
| 2020/0192179 | A1 | 6/2020 | Hajimiri |
| 2020/0284910 | A1 | 9/2020 | Yaacobi et al. |
| 2020/0409229 | A1* | 12/2020 | Morton .................... G02F 1/212 |
| 2021/0063776 | A1* | 3/2021 | Larson ...................... H01S 5/50 |
| 2021/0067251 | A1 | 3/2021 | Park et al. |
| 2021/0149227 | A1 | 5/2021 | Lee et al. |
| 2021/0364695 | A1 | 11/2021 | Shin et al. |
| 2022/0099893 | A1* | 3/2022 | Paudel ...................... G02B 6/14 |
| 2022/0137295 | A1* | 5/2022 | Grillanda ........... G02B 6/12028 385/131 |

OTHER PUBLICATIONS

Office Action dated Sep. 16, 2021 in connection with U.S. Appl. No. 17/174,132, 18 pages.

Notice of Allowance dated Aug. 17, 2022 in connection with U.S. Appl. No. 17/174,180, 10 pages.

Notice of Allowance dated Jun. 23, 2022 in connection with U.S. Appl. No. 17/174,132, 16 pages.

Office Action dated Oct. 6, 2022 in connection with U.S. Appl. No. 17/174,173, 10 pages.

International Search Report and Written Opinion of the International Searching Authority dated Feb. 24, 2022 in connection with International Patent Application No. PCT/US2021/059421, 16 pages.

International Search Report and Written Opinion of the International Searching Authority dated Apr. 8, 2022 in connection with International Patent Application No. PCT/US2021/064527, 10 pages.

Office Action dated Apr. 13, 2022 in connection with U.S. Appl. No. 17/174,132, 20 pages.

Blumenthal, "Silicon Nitride in Silicon Photonics," Proceedings of the IEEE, vol. 106, No. 12, Dec. 2018, 23 pages.

He et al., "Review of Photonic Integrated Optical Phased Arrays for Space Optical Communication," IEEE Access, vol. 8, Oct. 2020, 16 pages.

Creedon et al., "High efficiency coherent beam combining of semiconductor optical amplifiers," Optics Letters, vol. 37, No. 23, Dec. 2012, 3 pages.

Fatemi et al., "A Nonuniform Sparse 2-D Large-FOV Optical Phased Array With a Low-Power PWM Drive," IEEE Journal of Solid-State Circuits, vol. 54, Issue 5, May 2019, 16 pages.

Heidel et al., "A Review of Electronic-Photonic Heterogeneous Integration at DARPA," IEEE Journal of Selected Topics in Quantum Electronics, vol. 22, No. 6, Nov. 2016, 9 pages.

Kim et al., "A Single-Chip Optical Phased Array in a Wafer-Scale Silicon Photonics / CMOS 3D-Integration Platform," EEE Journal of Solid-State Circuits, vol. 54, Issue 11, Nov. 2019, 14 pages.

Komljenovic et al., "On-chip calibration and control of optical phased arrays," Optics Express, vol. 26, No. 3, Jan. 2018, 12 pages.

Larocque et al., "Beam steering with ultracompact and low-power silicon resonator phase shifters," Optics Express, vol. 27, No. 24, Nov. 2019, 16 pages.

Li et al., "Fast Optical Phased Array Calibration Technique for Random Phase Modulation LiDAR," IEEE Photonics Journal, vol. 11, No. 1, Feb. 2019, 10 pages.

Marron et al., "Atmospheric turbulence correction using digital holographic detection: experimental results," Optics Express, vol. 17, No. 14, Jul. 2009, 14 pages.

Marron et al., "Extended-range digital holographic imaging," Proc. of SPIE, vol. 7684 76841J, 2010, 6 pages.

Mehta et al., "An Optically Sampled ADC in 3D Integrated Silicon-Photonics/65nm CMOS," IEEE 2020 Symposium on VLSI Technology Digest of Technical Papers—THL.3, 2020, 2 pages.

Orcutt et al., "Open foundry platform for high-performance electronic-photonic integration," Optics Express, vol. 20, No. 11, May 2012, 11 pages.

Sayyah et al., "Two-dimensional pseudo-random optical phased array based on tandem optical injection locking of vertical cavity surface emitting lasers," Optics Express, vol. 23, No. 15, Jul. 2015, 12 pages.

Zhang et al., "Phase Calibration of On-Chip Optical Phased Arrays via Interference Technique," IEEE Photonics Journal, vol. 12, No. 2, Apr. 2020, 11 pages.

Kendrick et al., "Photonic Integrated Circuit Distance Measuring Interferometer," U.S. Appl. No. 16/929,907, filed Jul. 15, 2020, 35 pages.

Yengst et al., "Digital Input Circuit Design for Photonic Integrated Circuit," U.S. Appl. No. 17/174,173, filed Feb. 11, 2021, 59 pages.

Palese et al., "Photonic Integrated Circuit-Based Communication Transmit/Receive Patent System," U.S. Appl. No. 17/174,132, filed Feb. 11, 2021, 61 pages.

Kendrick et al., "Photonic Integrated Circuit-Based Optical Phased Array Phasing Technique," U.S. Appl. No. 17/174,180, filed Feb. 11, 2021, 60 pages.

Namdar et al., "Photonic Integrated Circuit-Based Optical Phased Array Calibration Technique," U.S. Appl. No. 17/174,197, filed Feb. 11, 2021, 61 pages.

Non-Final Office Action dated Nov. 9, 2023 in connection with U.S. Appl. No. 17/174,197, 7 pages.

\* cited by examiner

PHOTONIC INTEGRATED CIRCUIT-BASED COHERENTLY PHASED ARRAY LASER TRANSMITTER

TECHNICAL FIELD

This disclosure relates generally to laser systems. More specifically, this disclosure relates to a photonic integrated circuit (PIC)-based coherently phased array laser transmitter.

BACKGROUND

Next-generation optical phased arrays (OPAs) are being designed using photonic integrated circuits (PICs). A photonic integrated circuit refers to a device that integrates multiple photonic or light-based functions into the device. Optical phased arrays typically use frequency-stabilized laser transmitters with multiple watts of power. Often times, separate laser modules are fabricated and then fiber-coupled to photonic integrated circuits.

SUMMARY

This disclosure relates to a photonic integrated circuit (PIC)-based coherently phased array laser transmitter.

In a first embodiment, an apparatus includes a photonic integrated circuit, which includes at least one splitter configured to split at least one input beam into multiple input beamlets and multiple phase modulators configured to phase-shift at least some of the input beamlets. The apparatus also includes an array of optical amplifiers configured to amplify the phase-shifted input beamlets and generate amplified beamlets. The apparatus further incudes a beam combiner configured to combine the amplified beamlets and generate an output beam. In addition, the apparatus includes a controller configured to control the phase modulators in order to adjust phasing of the phase-shifted input beamlets.

In a second embodiment, a system includes multiple modules. Each module includes a photonic integrated circuit, which includes at least one splitter configured to split at least one input beam into multiple input beamlets and multiple phase modulators configured to phase-shift at least some of the input beamlets. Each module also includes an array of optical amplifiers configured to amplify the phase-shifted input beamlets and generate amplified beamlets. The system also includes optics configured to combine the amplified beamlets from the modules and generate an output beam. The system further includes one or more controllers configured to control the phase modulators of the modules in order to adjust phasing of the phase-shifted input beamlets of the modules.

In a third embodiment, a method includes, using a photonic integrated circuit, splitting at least one input beam into multiple input beamlets and phase-shifting at least some of the input beamlets. The method also includes, using an array of optical amplifiers, amplifying the phase-shifted input beamlets and generate amplified beamlets. The method further includes combining the amplified beamlets to generate an output beam. In addition, the method includes controlling the phase modulators in order to adjust phasing of the phase-shifted input beamlets.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 8, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, next-generation optical phased arrays (OPAs) are being designed using photonic integrated circuits (PICs). Optical phased arrays typically use frequency-stabilized laser transmitters with multiple watts of power. Often times, separate laser modules are fabricated and then fiber-coupled to photonic integrated circuits. However, this generally increases the size, weight, and power (SWAP) and the overall complexity of a system, which can be particularly problematic when attempting to create higher-power laser transmitters.

This disclosure provides various architectures for photonic integrated circuit (PIC)-based coherently phased array laser transmitters. As described in more detail below, multiple laser components can be integrated onto a PIC, and lower-power laser outputs can be generated and combined to create a higher-power laser output (such as a multi-watt laser output). Various approaches are disclosed for combining the lower-power laser outputs to produce the higher-power laser output. In some cases, multiple modules can be used to produce multiple higher-power laser outputs, and those laser outputs can be combined to produce an even higher-power laser output. The laser transmitters here can thereby support the use of multiple frequency-stabilized laser sources, which may allow for the creation of frequency-stabilized high-energy laser (HEL) outputs or other higher-power outputs.

In some embodiments, a coherently phased array laser transmitter includes a PIC-based phased array front end that generates multiple laser signals, an amplifier array that amplifies the laser signals, and optical elements that combine the amplified laser signals to produce a higher-power output. In particular embodiments, all of these components may be implemented using a silicon-based photonic integrated circuit and other silicon-based components, which may allow for fabrication of the laser transmitter using standard semiconductor fabrication techniques. In some cases, the laser transmitter coherently combines outputs from high-power amplifiers and functions as a diffraction-limited diode coherently beam combined (CBC) laser source.

The use of a PIC-based front end enables the replacement of an external erbium-doped fiber amplifier (EDFA) laser source or other external laser source, and it enables the use of a broader range of higher-efficiency diode semiconductor optical amplifiers (SOAs) due to significantly-higher feedback bandwidths (such as up to about 10 GHz or more). Also, on-PIC phase and feedback control can be used to enable significantly-higher bandwidths, which allows master oscillator-power amplifier (MOPA), optical phase locked looped oscillator, and other higher-bandwidth architectures to be realized. Higher bandwidths open up these architectures to the use of more-efficient and higher-power semiconductor optical amplifier diodes, and ultra-compact PIC physical dimensions can make the architectures more resilient to environmental perturbations (such as temperature changes, vibrations, and shock). Further, features such as on-chip pulsed low-leakage single-detector electronic-frequency tagging and/or heterodyne interferometry may be used for high channel count scalability. In addition, large reductions in size and weight (such as up to 90% reductions or more) and large improvements in electrical efficiency (such as from 40% to 65% or more) can be achieved.

This type of functionality may find use in a large number of applications. For example, this functionality may be used in data centers or telecommunication systems to transport information rapidly between locations, including the transport of large amounts of information over very large distances. This functionality may be used in consumer or commercial electronic devices, biomedical devices, or advanced computing devices to support optical-based communications with those devices. This functionality may be used in airplanes, drones, satellites, autonomous vehicles, rockets, missiles, or other commercial or defense-related systems. As particular examples, this functionality may be used in laser-based communication systems (such as ground-to-space or space-to-ground systems) and HEL systems (such as those generating output beams of about 10 kW or more of optical power). In laser-based communication systems, frequency hopping can be provided for resiliency against jamming or interception, compensation for Doppler shifts and atmospheric phase distortions can be supported, and an on-PIC absolute frequency reference can be provided for coherent communication. Also, integrating a PIC-based or other optical phased array and optical receiver into the architecture allows for the creation of a low-cost, compact, free-space or other optical transceiver, and on-chip intensity and phase modulations at high rates (such as up to about 50 GHz or more) can support the use of coherent and direct detect waveforms. In HEL systems, the described architectures can be scaled up to very large numbers of elements (such as tens of millions of elements) to achieve desired power levels, feedback loops can operate at high rates (such as up to about 10 GHz or more), and suitable thermal management approaches (such as high thermal conductivity micro-pillar silicon vapor heat pipes and heat capacity thermal designs) can be provided to reduce the size and weight of the overall systems. Note, however, that this disclosure is not limited to any particular application of the described functionality.

Figure 1:
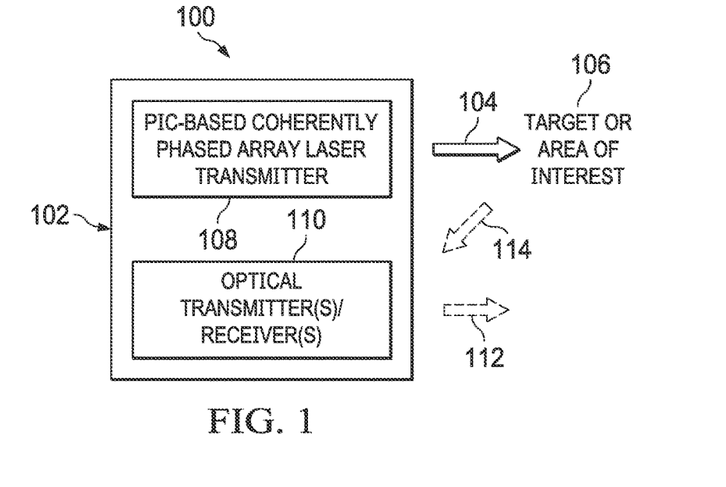
FIG. 1 illustrates an example system supporting a photonic integrated circuit (PIC)-based coherently phased array laser transmitter according to this disclosure.

FIG. 1 illustrates an example system 100 supporting a PIC-based coherently phased array laser transmitter according to this disclosure. As shown in FIG. 1, the system 100 includes a node 102 configured to generate optical signals 104 and transmit the optical signals 104 towards at least one target or area of interest 106. The purpose (and therefore the power level) of the optical signals 104 and the type(s) of the target(s) or area(s) of interest 106 can vary depending on the application. For example, in a laser communication system, the optical signals 104 may have a power level of tens or hundreds of watts, and the target(s) or area(s) of interest 106 may include one or more devices each having an optical receiver configured to receive and process the optical signals 104. In an HEL system, the optical signals 104 may have a much higher power level, such as about 10 kW or more, and the target(s) or area(s) of interest 106 may include one or more objects to be damaged or destroyed. Note, however, that this disclosure is not limited to these two examples and that the node 102 and the optical signals 104 may be used for any other suitable purposes.

The node 102 in this example includes at least one PIC-based coherently phased array laser transmitter 108, which operates to produce the optical signals 104. In general, the laser transmitter 108 includes one or more photonic integrated circuits, which may be used to implement one or more of a phased array front end, an amplifier array, and one or more optical elements. Example embodiments of the laser transmitter 108 are described below.

The node 102 may also optionally include one or more optical transmitters and/or receivers 110. The optical transmitters/receivers 110 may be used to support other functions of the node 102, and these functions may or may not relate to operation of the laser transmitter 108. For example, the optical transmitters/receivers 110 may be used to transmit other optical signals 112, such as beacons that allow other devices to identify and locate the node 102. The optical transmitters/receivers 110 may be used to receive other optical signals, such as when the target or area of interest 106 represents another node having a laser transmitter 108 or other transmitter that generates optical signals 114 transmitted to the node 102. The optical transmitters/receivers 110 may be used to transmit or receive any other or additional optical signals as needed or desired.

Although FIG. 1 illustrates one example of a system 100 supporting a PIC-based coherently phased array laser transmitter 108, various changes may be made to FIG. 1. For example, while only one node 102 and one target or area of interest 106 are shown here, the system 100 may include any suitable number of nodes and targets or areas of interest. Also, each node of the system 100 may include any suitable number of laser transmitters and other components. In addition, the system 100 is shown in simplified form here and may include any number of additional components in any suitable configuration as needed or desired.

Figure 2:
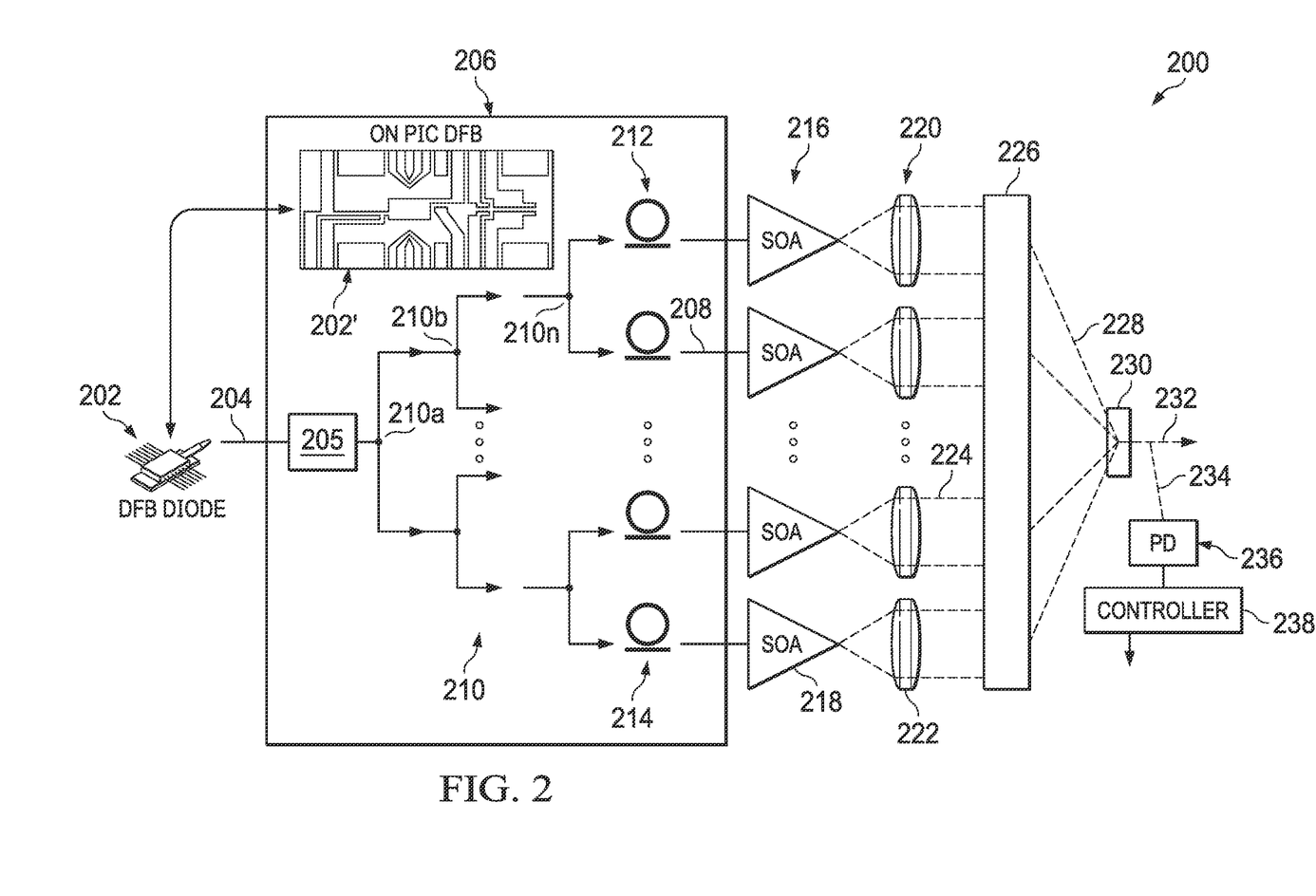
FIG. 2 illustrates an example direct-diode coherently beam combined (CBC) bar architecture for use in a PIC-based coherently phased array laser transmitter according to this disclosure.

FIG. 2 illustrates an example direct-diode coherently beam combined (CBC) bar architecture 200 for use in a PIC-based coherently phased array laser transmitter according to this disclosure. The architecture 200 here may, for example, be used to form at least part of the laser transmitter 108 in the system 100 of FIG. 1. However, the architecture 200 may be used with any other suitable device and in any other suitable system.

As shown in FIG. 2, the architecture 200 includes at least one laser 202, which operates to produce a lower-power input beam 204. The laser 202 includes any suitable structure configured to generate a laser output, such as a distributed feedback (DFB) diode laser. Although not shown here, the output of the laser 202 may be processed by one or more other components. For instance, the output of the laser 202 may be provided to an electro-optic modulator (EOM) that modulates the laser output, such as when the EOM is implemented using a Mach-Zehnder modulator that provides amplitude modulation. The lower-power input beam 204 can have any suitable power level based on the laser 202 being used for a specific application. In some cases, the lower-power input beam 204 may have a power level of one or several tens of milliwatts to one or several hundreds of milliwatts, although these values are for illustration only. Also, in some cases, the laser 202 may be fabricated using at least one group III element and at least one group V element and may therefore be referred to as a "III-V" laser. However, any other suitable materials may be used to fabricate the laser 202. In some embodiments, the laser 202 may function as a master oscillator that is configured to frequency-hop or frequency-shift the lower-power input beam 204. The master oscillator here may be tunable in order to help compensate for Doppler shifts or other effects that might impact the operation of the architecture 200. Optionally, an amplifier 205 may be used to pre-amplify the lower-power input beam 204 prior to further processing in the architecture 200. The amplifier 205 represents any suitable optical amplifier configured to amplify an optical signal.

A photonic integrated circuit 206 receives the lower-power input beam 204 and operates to produce multiple output beamlets 208. In this example, the photonic integrated circuit 206 includes a splitter 210, which generally operates to split the lower-power input beam 204 into optical signals traveling over different optical pathways. In this particular example, the splitter 210 includes a hierarchical arrangement of splitters 210a-210n, each of which can receive and split an optical input in order to produce two optical outputs of substantially equal power. Note that the number of splitters 210a-210n and the number of hierarchical levels of splitters 210a-210n can vary based on the number of output beamlets 208 to be produced. For example, there may be five levels of splitters if thirty-two output beamlets 208 are desired or six levels of splitters if sixty-four output beamlets 208 are desired. Note, however, that other numbers of output beamlets 208 may be produced using any suitable number of splitters. Also note that any other suitable structure(s) may be used here to split an input optical signal, such as a multi-mode interferometer or a coupler tree. In addition, note that while the laser 202 here is shown as being external to the photonic integrated circuit 206, the laser 202 may be integrated into the photonic integrated circuit 206, in which case the laser may represent an on-PIC laser 202'.

The optical outputs from the splitter 210 can be phase shifted using an array 212 of phase modulators 214, where each phase modulator 214 can shift the phase of one of the optical outputs. Each phase modulator 214 includes any suitable structure configured to phase-shift an optical signal, such as a resonant micro-ring modulator. In some embodiments, the resonant micro-ring modulators may be silicon-based and have diameters of about 0.5 millimeters, although other implementations of the phase modulators 214 may be used. The phase-shifted optical outputs represent the output beamlets 208.

The output beamlets 208 are provided to an array 216 of semiconductor optical amplifiers 218. Each semiconductor optical amplifier 218 amplifies one of the output beamlets 208 to produce a higher-power version of that beamlet 208. The higher-power versions of the beamlets 208 are provided to an array 220 of microlenses 222, each of which expands or otherwise processes one of the higher-power versions of the beamlets 208 to produce a higher-power beamlet 224. Each semiconductor optical amplifier 218 represents any suitable semiconductor-based amplifier configured to amplify an optical signal. Each microlens 222 represents any suitable optical device that expands or otherwise processes an optical signal from an optical amplifier to produce an amplified signal. Each of the higher-power beamlets 224 can have any suitable power level based on the semiconductor optical amplifiers 218 being used. In some cases, the higher-power beamlets 224 may each have a power level of about three watts, although this value is for illustration only.

In this example, the higher-power beamlets 224 are provided to a diffractive optic 226, which diffracts the higher-power beamlets 224 as diffracted beamlets 228 into a beam combiner 230. The beam combiner 230 combines the beamlets 228 to produce a higher-power output beam 232, which has a higher power (and typically a much higher power) relative to the lower-power input beam 204. For example, the higher-power output beam 232 may have a power of about 100 watts to about 110 watts, although other power levels may be used here. Also, in some embodiments, the higher-power output beam 232 may have a laser linewidth of about 100 MHz, although other linewidths may be achieved here. The diffractive optic 226 includes any suitable structure(s) configured to redirect beamlets via diffraction. In some cases, the diffractive optic 226 may be relatively small, such as when the diffractive optic 226 has a height of about one centimeter. Of course, the size of the diffractive optic 226 can vary based on a number of factors, such as the number of higher-power beamlets 224 being received. Note that while the diffractive optic 226 is shown here as being a single element, the diffractive optic 226 may be split into multiple diffractive optical elements, such as different diffractive optical elements used with different beamlets 224. The beam combiner 230 includes any suitable structure configured to combine beamlets into a combined beam.

To support control of the architecture 200, samples 234 of the output beam 232 (and/or of the input beam 204 and/or various beamlets 224 or 228) can be measured using at least one photodetector 236, such as one or more photodiodes. The samples 234 may be obtained in any suitable manner. Measurements from the photodetector(s) 236 can be provided to a controller 238, which may use the measurements to control the operations of other components in the architecture 200. For instance, the controller 238 may use the measurements to adjust the operation of the laser 202/202' or the phase modulators 214. As a particular example, the controller 238 may use the measurements to adjust the operation of the phase modulators 214 to help ensure that the diffracted beamlets 228 used to form the output beam 232 are all in phase with one another (at least to the largest extent possible). This allows for feedback control in order to achieve optical phase locking in the architecture 200. The controller 238 includes any suitable structure configured to process measurements and control other components. For example, the controller 238 may include one or more microprocessors, microcontrollers, digital signal processors (DSPs), field programmable gate arrays (FPGAs), application-specific integrated circuits (ASICs), or discrete circuitry.

The architecture 200 here is described as "direct-diode" since the architecture 200 can utilize a laser input directly from a diode laser (the laser 202 or 202'). Also, the architecture 200 here is described as "coherently beam combined" or "CBC" since the architecture 200 can achieve suitable optical phase locking when combining the beamlets 228 into the output beam 232. In addition, the architecture 200 here is described as "bar" since the architecture 200 can be implemented in a generally planar manner.

Although FIG. 2 illustrates one example of a direct-diode CBC bar architecture 200 for use in a PIC-based coherently phased array laser transmitter, various changes may be made to FIG. 2. For example, the architecture 200 may produce any suitable number of beamlets and include any suitable number of splitters, SOAs, and microlenses. Also, while one specific technique is shown in FIG. 2 for combining the beamlets 224, any other suitable techniques may be used. As one particular example, multiple lasers may be used to produce beamlets of different wavelengths, and an arrayed waveguide grating (AWG) may be used to combine the beamlets. As another particular example, multiple lasers may be implemented using vertical cavity surface emitting lasers (VCSELs) that are swept in frequency.

Figure 3:
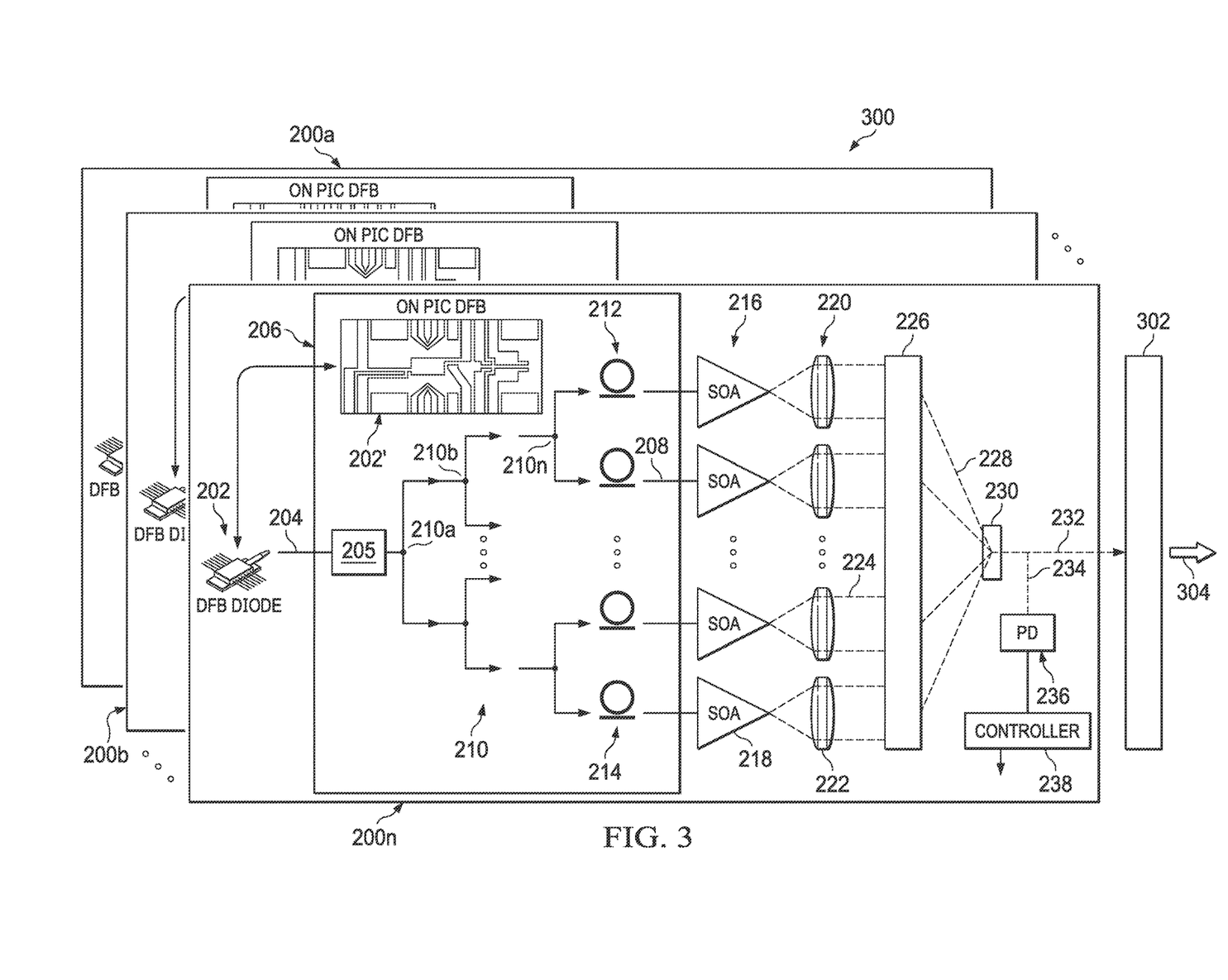
FIG. 3 illustrates an example scaling of direct-diode CBC bars for formation of a PIC-based coherently phased array laser transmitter according to this disclosure.

FIG. 3 illustrates an example scaling of direct-diode CBC bars for formation of a PIC-based coherently phased array laser transmitter 300 according to this disclosure. The laser transmitter 300 here may, for example, use multiple instances 200a-200n of the architecture 200 from FIG. 2 in order to form at least part of the laser transmitter 108 in the system 100 of FIG. 1. However, the laser transmitter 300 may use any other suitable architecture designed in accordance with this disclosure, and the laser transmitter 300 may be used in any other suitable system.

As shown in FIG. 3, the output beams 232 from multiple instances 200a-200n of the architecture 200 can be combined using a beam combiner 302 to produce an even higher-power output beam 304. The exact arrangement and operation of the beam combiner 302 can vary based on the implementation, such as based on the number and arrangement of the instances 200a-200n of the architecture 200. For example, some implementations of the beam combiner 302 may use mirrors or other optical devices to redirect at least some of the output beams 232 into desired positions and in desired directions. Some implementations of the beam combiner 302 may use acylindrical lenses or other lenses to focus at least some of the output beams 232 into a desired form. Further, if the multiple instances 200a-200n of the architecture 200 operate at different wavelengths or otherwise have output beams 232 of different spectral characteristics, the beam combiner 302 may use a spectral beam combining technique. In addition, depending on the number and arrangement of the multiple instances 200a-200n of the architecture 200, multiple levels of beam combining may be used to hierarchically combine the output beams 232. The beam combiner 302 includes one or more optical devices configured to combine multiple beams. The output beam 304 may have any suitable power level, such as about 10 kW or more.

Although FIG. 3 illustrates one example of the scaling of direct-diode CBC bars for formation of a PIC-based coherently phased array laser transmitter 300, various changes may be made to FIG. 3. For example, the laser transmitter 300 may include any suitable number of instances of the architecture 200 or other architecture in any suitable arrangement.

Figure 4:
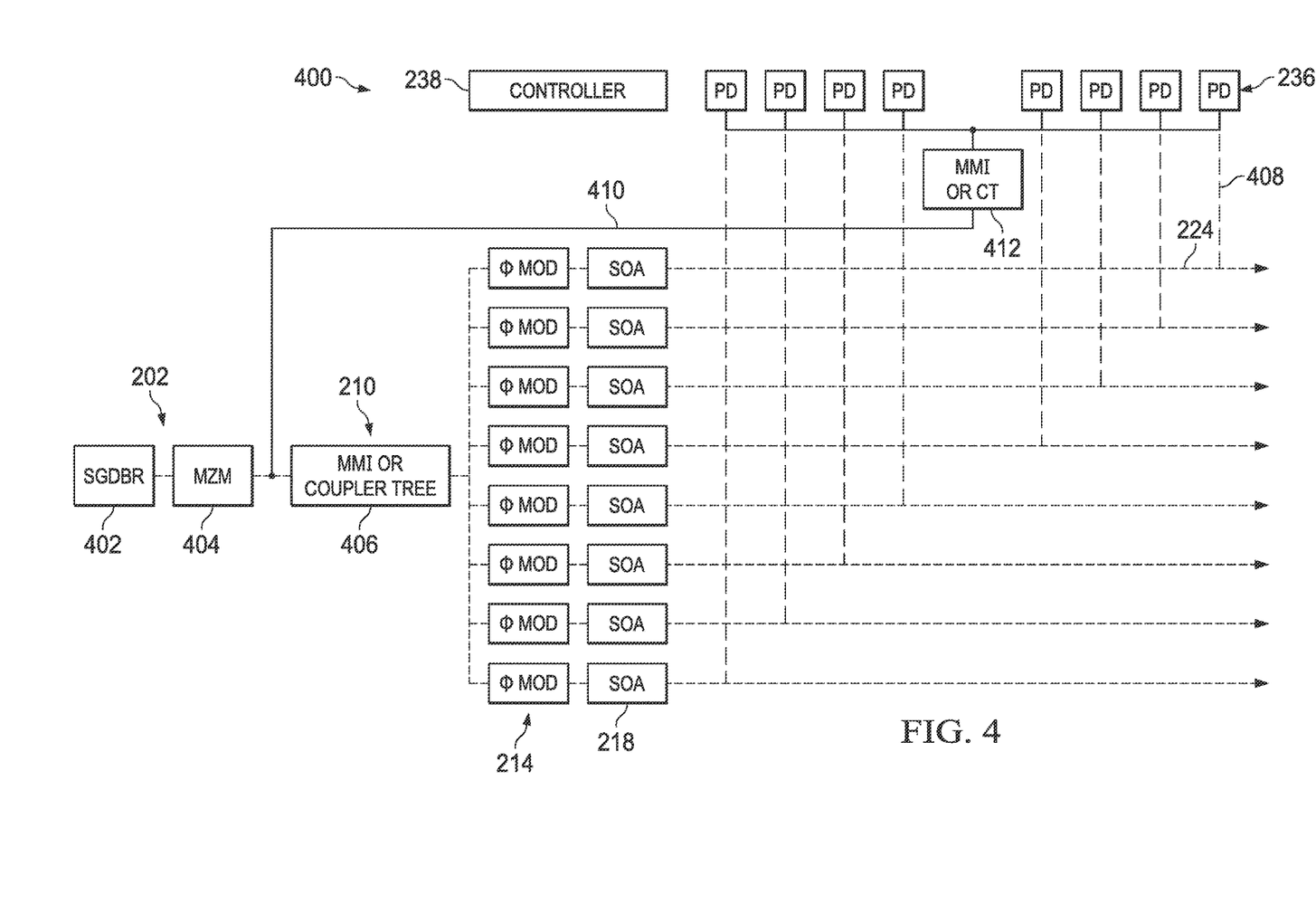
FIGS. 4 through 6 illustrate example phasing techniques for use in a PIC-based coherently phased array laser transmitter according to this disclosure.
Figure 5:
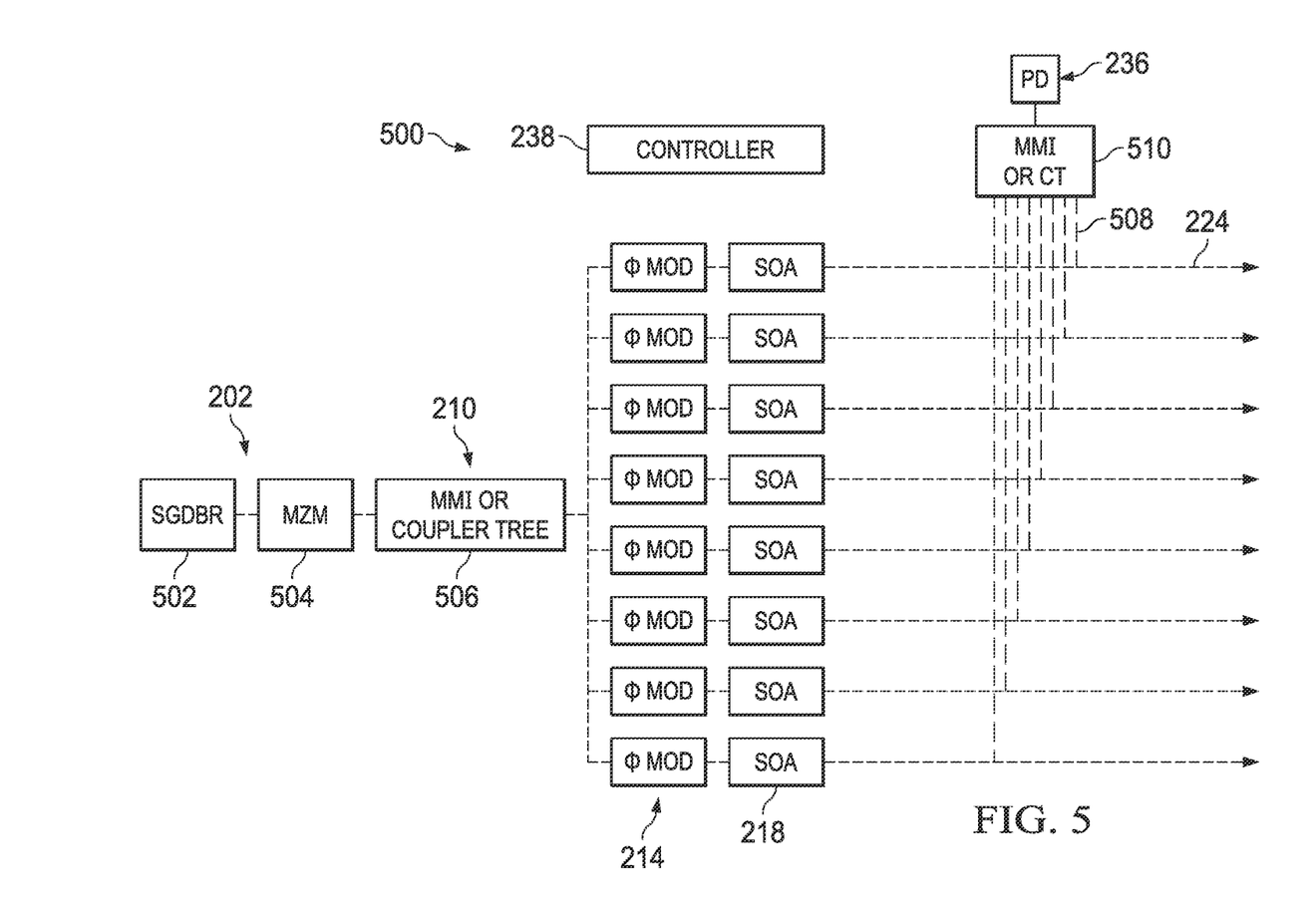
Figure 6:
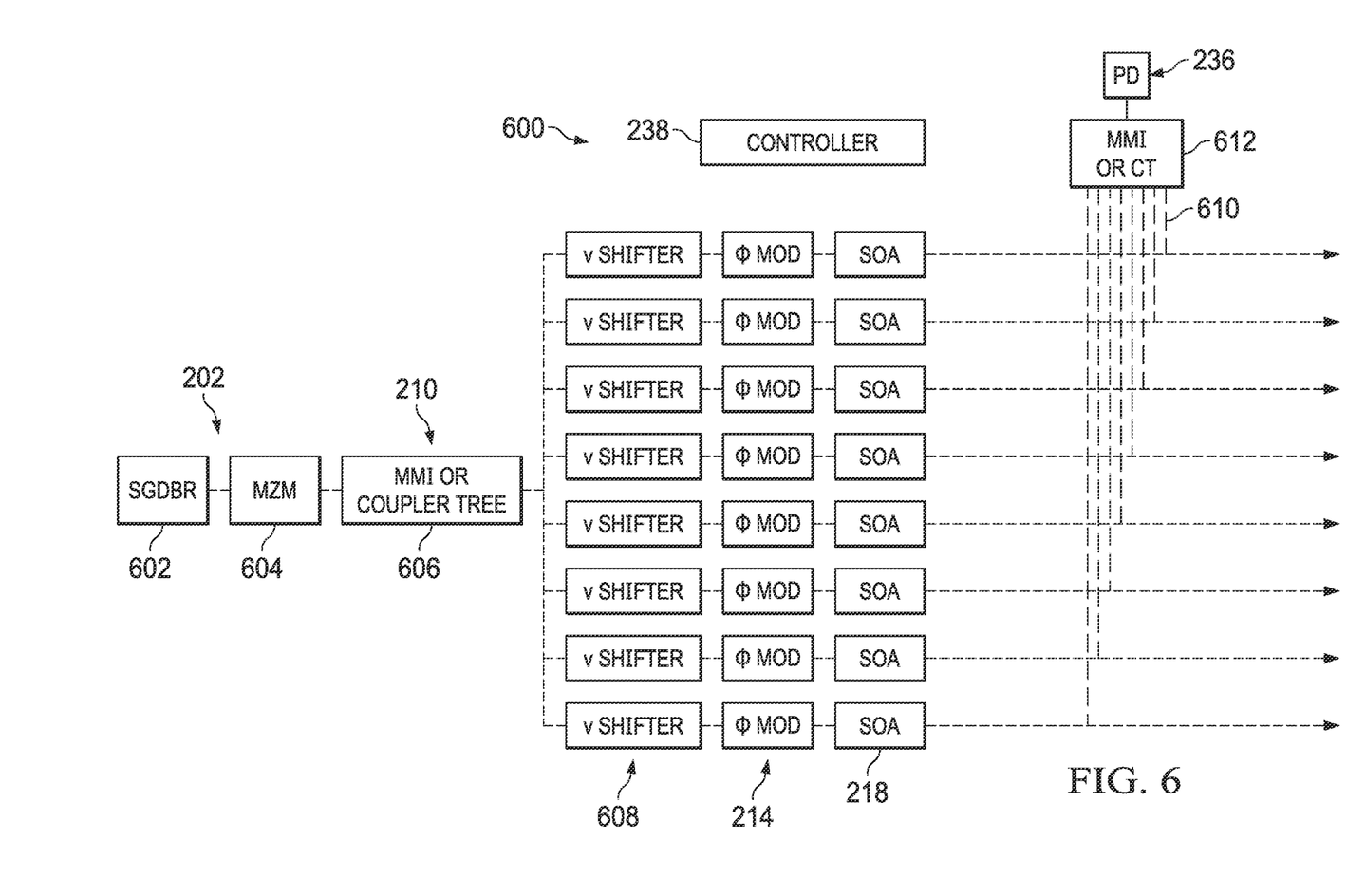

FIGS. 4 through 6 illustrate example phasing techniques for use in a PIC-based coherently phased array laser transmitter according to this disclosure. In particular, FIGS. 4 through 6 illustrate example techniques that may be used in the architecture 200 to control the phasing of the beamlets 228 relative to one another used to produce the output beam 232. For ease of explanation, this functionality may be used in the laser transmitter 108 in FIG. 1, the laser transmitter 300 in FIG. 3, or any other suitable device.

As shown in FIG. 4, a control architecture 400 supports a heterodyne technique for phase control. In this example, the laser 202 is implemented using a sampled grating distributed feedback (SGDFB) diode laser 402 and a Mach-Zehnder modulator (MZM) 404, although other forms for the laser 202 may be used here. Also, the splitter 210 is implemented using a multi-mode interferometer (MMI) or coupler tree (CT) 406, although other forms for the splitter 210 (such as splitters 210a-210n) may be used here.

The control architecture 400 includes a number of photodetectors 236. The photodetectors 236 receive mixed inputs, each of which represents a combination of (i) a sample 408 of one of the beamlets 224 and (ii) part of a sample 410 of the lower-power input beam 204 (which in this example comes from the diode laser 402 and the Mach-Zehnder modulator 404). The sample 410 here is split using another multi-mode interferometer or coupler tree 412, although another type of splitter or splitters may be used here. The mixed inputs received by the photodetectors 236 can be measured and the measurements can be provided to the controller 238, which allows the controller 238 to adjust the phase modulators 214 to provide heterodyne-based phase control.

As shown in FIG. 5, a control architecture 500 supports a gradient steepest decent (GSD) technique for phase control. In this example, the laser 202 is again implemented using an SGDFB diode laser 502 and a Mach-Zehnder modulator 504, although other forms for the laser 202 may be used here. Also, the splitter 210 is again implemented using a multi-mode interferometer or coupler tree 506, although other forms for the splitter 210 may be used here. The control architecture 500 includes a single photodetector 236 that receives samples 508 of the beamlets 224, where the samples 508 are combined using another multi-mode interferometer or coupler tree 510 (although other beam combiners may be used here). The combined input received by the photodetector 236 can be measured and the measurements can be provided to the controller 238, which allows the controller 238 to adjust the phase modulators 214 to provide GSD-based phase control.

As shown in FIG. 6, a control architecture 600 supports a pulse leakage level locking of optical coherence by single-detector electronic-frequency tagging (PPL-LOCSET) technique for phase control. In this example, the laser 202 is again implemented using an SGDFB diode laser 602 and a Mach-Zehnder modulator 604, although other forms for the laser 202 may be used here. Also, the splitter 210 is again implemented using a multi-mode interferometer or coupler tree 606, although other forms for the splitter 210 may be used here. However, in this example, the beamlets produced by the splitter 210 are provided to an array of frequency shifters 608, which can shift the frequencies of the beamlets (such as under the control of the controller 238). The control architecture 600 includes a single photodetector 236 that receives samples 610 of the beamlets 224, where the samples 610 are combined using another multi-mode interferometer or coupler tree 612 (although other beam combiners may be used here). The combined input received by the photodetector 236 can be measured and the measurements can be provided to the controller 238, which allows the controller 238 to adjust the phase modulators 214 and the frequency shifters 608 to provide PPL-LOCSET-based control.

In all three of these embodiments, the control architectures 400, 500, and 600 can be used to provide high-bandwidth PIC-based coherent phase control, which allows for nested loop control in large arrays (such as arrays of up to tens of millions of elements or more). Note that, depending on the design, the one or more photodetectors 236 shown here in each of the control architectures 400, 500, and 600 can be on-chip (meaning they are integrated into a PIC) or external.

Although FIGS. 4 through 6 illustrate examples of phasing techniques for use in a PIC-based coherently phased array laser transmitter, various changes may be made to FIGS. 4 through 6. For example, FIGS. 4 through 6 illustrate the components used to generate and sample eight beamlets 224, although any suitable number of beamlets 224 can be generated and sampled here. Also, any other suitable phasing techniques may be used in PIC-based coherently phased array laser transmitters.

Figure 7:
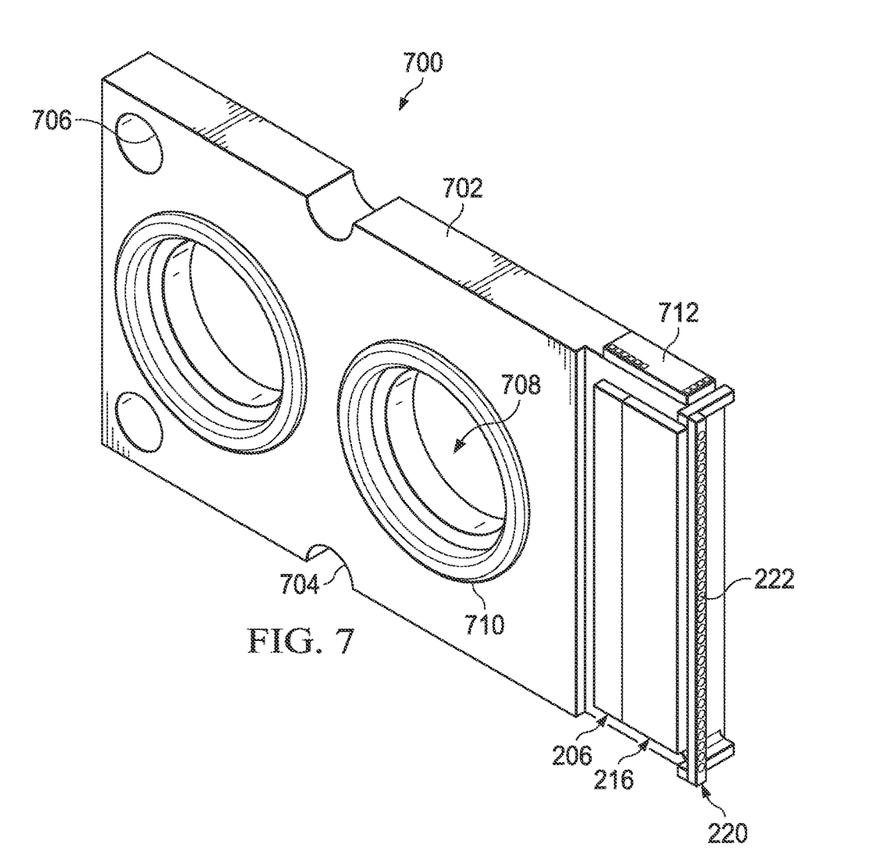
FIGS. 7 and 8 illustrate a specific example implementation of a PIC-based coherently phased array laser transmitter according to this disclosure.
Figure 8:
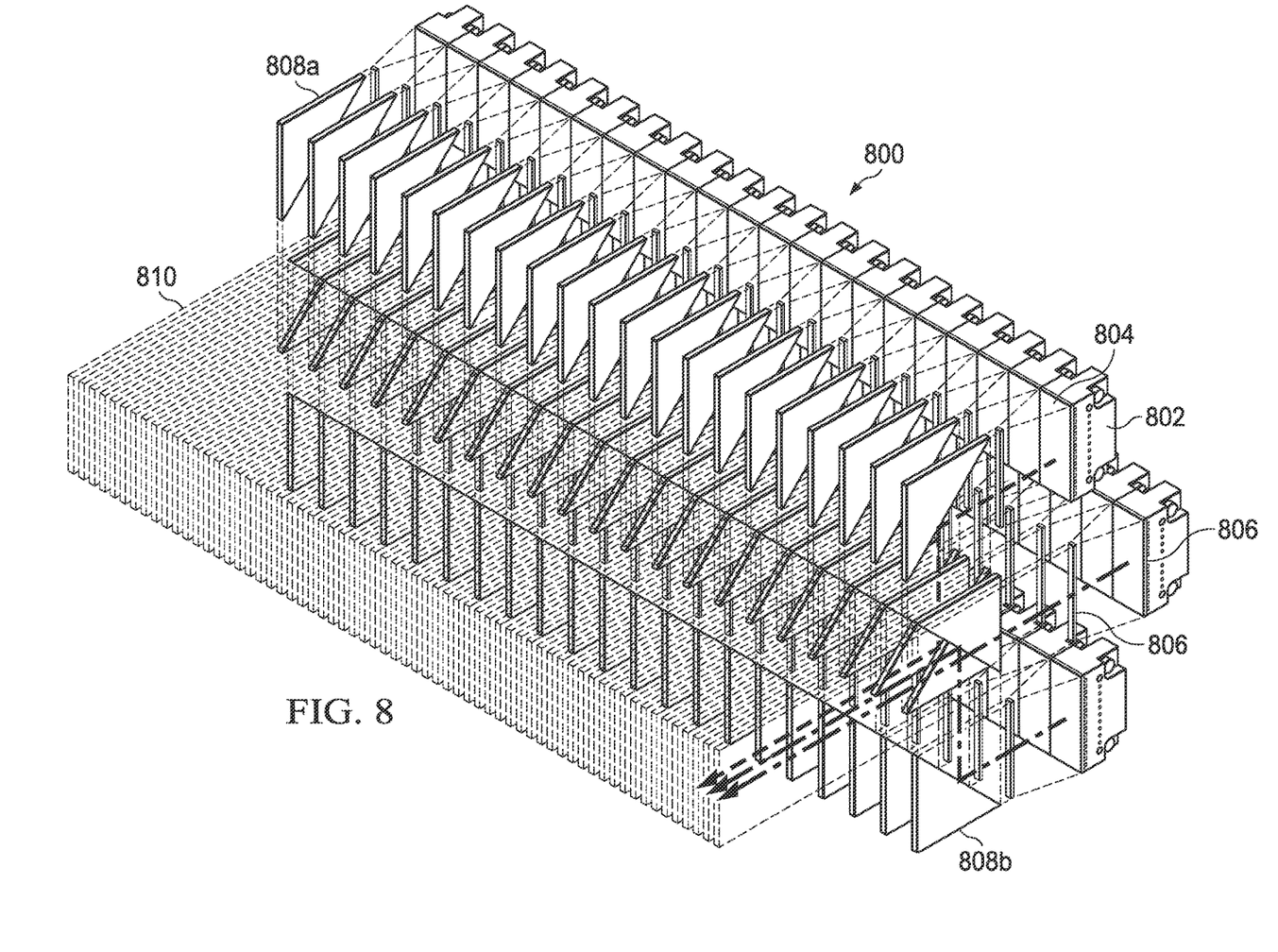

FIGS. 7 and 8 illustrate a specific example implementation of a PIC-based coherently phased array laser transmitter according to this disclosure. In particular, FIG. 7 illustrates an example module 700 that incorporates various elements of the architecture 200, and FIG. 8 illustrates an example laser transmitter 800 in which multiple instances of the module 700 can be used. The laser transmitter 800 here may, for example, represent a specific implementation of the laser transmitter 108 in the system 100 of FIG. 1 or the laser transmitter 300 of FIG. 3, although the laser transmitter 800 may be used in any other suitable system.

As shown in FIG. 7, the module 700 includes the photonic integrated circuit 206 (which can include at least one on-PIC laser 202'), the array 216 of semiconductor optical amplifiers 218, and the array 220 of microlenses 222. These components are positioned on a cooler 702, which can remove thermal energy from these components during operation. In this example, the cooler 702 is formed as an elongated structure, with the components 206, 216, 220 positioned at or near one end of the elongated structure. The cooler 702 includes recesses 704 on top and bottom edges of the cooler 702, which may receive projections or other portions of a larger structure. The cooler 702 also includes openings 706 along one side edge of the cooler 702, which may receive bolts or other connectors. These help to removably hold the cooler 702 in place within a larger structure, such as the laser transmitter 800. The cooler 702 further includes fluid openings 708 and seals 710 that can be positioned on opposite sides of each opening 708, where the openings 708 can receive a cooling fluid that removes thermal energy from the cooler 702.

The cooler 702 may be formed from any suitable material(s), such as copper or other metal(s), and in any suitable manner. While two recesses 704 and two openings 706 are shown here as being used to help secure the cooler 702 in place, the numbers and positions of the recesses 704 and openings 706 are for illustration only, and other or additional mechanisms may be used to secure the cooler 702. Also, while two fluid openings 708 and associated seals 710 are shown here, the numbers and positions of the fluid openings 708 and seals 710 are for illustration only. The cooler 702 in general may have any suitable form that allows thermal energy to be removed from the components 206, 216, 220.

An interface 712 is positioned along at least one side of the cooler 702 and can provide one or more electrical connections between one or more of the components 206, 216, 220 and one or more external devices or systems. For instance, the interface 712 may provide one or more electrical connections between the controller 238 and an external control board or other external system. The interface 712 may be formed from any suitable material(s), such as ceramic with copper or other metal/conductive pass-throughs, and in any suitable manner.

The module 700 shown in FIG. 7 may have a compact form. For example, in some embodiments, the module 700 may have a length of about 27.6 millimeters and a height of about 10.8 millimeters. However, the size of the module 700 can vary based on a number of factors, including the number of beamlets being produced by the module 700. Similarly, the shape of the module 700 can vary based on a number of factors.

As shown in FIG. 8, multiple diode array assemblies 802 are positioned next to each other in multiple rows. Each diode array assembly 802 may contain one or more instances of the module 700 of FIG. 7. In this particular example, there are three rows of diode array assemblies 802, and each row includes twenty-one diode array assemblies 802. However, the number and arrangement of the diode array assemblies 802 are for illustration only and can vary as needed or desired.

Multiple sets of beamlets 804 that are output from the modules 700 in the diode array assemblies 802 can be passed through various acylindrical lenses 806 for inline focusing. A subset of the beamlets 804 (from the top row of diode array assemblies 802) can be reflected downward using mirrors 808a, and another subset of the beamlets 804 (from the bottom row of diode array assemblies 802) can be reflected upward using mirrors 808b. Additional mirrors positioned in front of the central row of diode array assemblies 802 can be used to reflect the beamlets 804 from the top and bottoms rows outward in the same direction as the beamlets 804 from the central row. Effectively, this causes all beamlets 804 from all rows of diode array assemblies 802 to collectively form a high-power output beam 810.

The overall structure of the laser transmitter 800 shown in FIG. 8 may have a relatively compact form. For example, in some embodiments, the laser transmitter 800 can have a width (measured side-to-side in FIG. 8) of about 240 millimeters and a height (measured top-to-bottom in FIG. 8) of about 94 millimeters. However, the size of the laser transmitter 800 can vary based on a number of factors, including the number and arrangement of diode array assemblies 802 used in the laser transmitter 800. Also, one or more controllers (such as one or more instances of the controllers 238 described above) may be used in the modules 700 of the diode array assemblies 802 or other locations of the laser transmitter 800 to control the operation of the modules 700. It is possible here for a single controller 238 to control the operation of multiple modules 700, although other embodiments may be used here.

Although FIGS. 7 and 8 illustrate one specific example of an implementation of a PIC-based coherently phased array laser transmitter 800, various changes may be made to FIGS. 7 and 8. For example, the module 700 may have any other suitable form factor. Also, the laser transmitter 800 may include any suitable number and arrangement of the modules 700, and the beamlets 804 from the modules 700 may be combined using mirrors or in any other suitable manner.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a photonic integrated circuit comprising at least one splitter configured to split at least one input beam into multiple input beamlets, the photonic integrated circuit further comprising multiple phase modulators configured to phase-shift at least some of the input beamlets;
an array of optical amplifiers configured to amplify the phase-shifted input beamlets and generate amplified beamlets;
a beam combiner configured to combine the amplified beamlets and generate an output beam;
at least one optic configured to direct the amplified beamlets towards the beam combiner, the at least one optic comprising at least one diffractive optical element configured to diffract at least some of the amplified beamlets by different amounts while the amplified beamlets are passing through the at least one diffractive optical element in order to direct the amplified beamlets towards the beam combiner; and
a controller configured to control the phase modulators in order to adjust phasing of the phase-shifted input beamlets.

2. The apparatus of claim 1, further comprising:
at least one laser configured to generate the at least one input beam.

3. The apparatus of claim 2, wherein the at least one laser is integrated into the photonic integrated circuit.

4. The apparatus of claim 1, wherein:
the at least one splitter comprises at least one of: multiple Y-splitters, a multi-mode interferometer, and a coupler tree;
the phase modulators comprise resonant micro-ring modulators; and
the optical amplifiers comprise semiconductor optical amplifiers.

5. The apparatus of claim 1, further comprising:
an array of microlenses configured to modify the amplified beamlets prior to combination by the beam combiner.

6. The apparatus of claim 1, further comprising:
at least one photodetector configured to generate measurements of samples of the amplified beamlets;
wherein the controller is configured to perform one of heterodyne, gradient steepest decent (GSD), or pulse leakage level locking of optical coherence by single-detector electronic-frequency tagging (PPL-LOCSET) control of the phasing.

7. The apparatus of claim 1, further comprising:
a cooler on which the photonic integrated circuit and the array of optical amplifiers are positioned, the cooler configured to remove thermal energy from the photonic integrated circuit and the array of optical amplifiers.

8. The apparatus of claim 7, wherein:
the cooler has an elongated rectangular form, the photonic integrated circuit and the array of optical amplifiers positioned proximate to a first shorter side edge of the cooler;
two longer side edges of the cooler include one or more recesses configured to receive projections;
a second shorter side edge of the cooler opposite the first shorter side edge of the cooler includes one or more openings configured to receive connectors;
one or more fluid openings extend through the cooler and are configured to receive a cooling fluid;
seals are positioned on opposite sides of each of the one or more fluid openings; and
an interface is positioned along at least one of the side edges of the cooler and is configured to provide one or more electrical connections.

9. The apparatus of claim 1, wherein:
the at least one splitter is configured to split the at least one input beam into at least thirty-two input beamlets;
the photonic integrated circuit comprises at least thirty-two phase modulators; and
the array of optical amplifiers comprises at least thirty-two optical amplifiers.

10. A system comprising:
multiple modules each comprising:
a photonic integrated circuit comprising at least one splitter configured to split at least one input beam into multiple input beamlets, the photonic integrated circuit further comprising multiple phase modulators configured to phase-shift at least some of the input beamlets;

an array of optical amplifiers configured to amplify the phase-shifted input beamlets and generate amplified beamlets;

a first beam combiner configured to combine the amplified beamlets and generate an output beamlet; and at least one optic configured to direct the amplified beamlets towards the first beam combiner, the at least one optic comprising at least one diffractive optical element configured to diffract at least some of the amplified beamlets by different amounts while the amplified beamlets are passing through the at least one diffractive optical element in order to direct the amplified beamlets towards the first beam combiner;

a second beam combiner configured to combine the output beamlets from the modules and generate an output beam; and one or more controllers configured to control the phase modulators of the modules in order to adjust phasing of the phase-shifted input beamlets of the modules.

11. The system of claim 10, wherein each module further comprises:

at least one laser configured to generate the at least one input beam.

12. The system of claim 11, wherein, in each module, the at least one laser of the module is integrated into the photonic integrated circuit of the module.

13. The system of claim 10, wherein each module further comprises:

an array of microlenses configured to modify the amplified beamlets prior to combination by the first beam combiner.

14. The system of claim 10, wherein:

each module further comprises at least one photodetector configured to generate measurements of samples of the amplified beamlets; and the one or more controllers are configured to perform one of heterodyne, gradient steepest decent (GSD), or pulse leakage level locking of optical coherence by single-detector electronic-frequency tagging (PPL-LOCSET) control of the phasing.

15. The system of claim 10, wherein each module further comprises:

a cooler on which the photonic integrated circuit of the module and the array of optical amplifiers of the module are positioned, the cooler configured to remove thermal energy from the photonic integrated circuit and the array of optical amplifiers.

16. The system of claim 15, wherein each cooler comprises one or more fluid openings configured to allow fluid to flow through the cooler and remove the thermal energy from the cooler.

17. The system of claim 16, wherein, in each module:

the cooler has an elongated rectangular form, the photonic integrated circuit and the array of optical amplifiers positioned proximate to a first shorter side edge of the cooler;

two longer side edges of the cooler include one or more recesses configured to receive projections;

a second shorter side edge of the cooler opposite the first shorter side edge of the cooler includes one or more openings configured to receive connectors;

one or more fluid openings extend through the cooler and are configured to receive a cooling fluid;

seals are positioned on opposite sides of each of the one or more fluid openings; and an interface is positioned along at least one of the side edges of the cooler and is configured to provide one or more electrical connections.

18. The system of claim 10, wherein the output beam has a power level of at least 10 kW.

19. A method comprising:

using a photonic integrated circuit, splitting at least one input beam into multiple input beamlets and phase-shifting at least some of the input beamlets using phase modulators of the photonic integrated circuit;

using an array of optical amplifiers, amplifying the phase-shifted input beamlets and generating amplified beamlets;

diffracting at least some of the amplified beamlets by different amounts while the amplified beamlets are passing through at least one diffractive optical element;

combining the amplified beamlets after the diffracting to generate an output beam; and controlling the phase modulators in order to adjust phasing of the phase-shifted input beamlets.

20. The method of claim 19, wherein:

multiple modules comprise photonic integrated circuits and arrays of optical amplifiers, the multiple modules generating multiple sets of amplified beamlets; and the multiple sets of amplified beamlets from the multiple modules are combined to generate the output beam.

* * * * *